(12) United States Patent
Chae et al.

(10) Patent No.: US 6,670,670 B2
(45) Date of Patent: Dec. 30, 2003

(54) SINGLE ELECTRON MEMORY DEVICE COMPRISING QUANTUM DOTS BETWEEN GATE ELECTRODE AND SINGLE ELECTRON STORAGE ELEMENT AND METHOD FOR MANUFACTURING THE SAME

(75) Inventors: Soo-doo Chae, Seoul (KR); Byong-man Kim, Gunpo (KR); Moon-kyung Kim, Yongin (KR); Hee-soon Chae, Yongin (KR); Won-il Ryu, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/125,597

(22) Filed: Apr. 19, 2002

(65) Prior Publication Data

US 2002/0167002 A1 Nov. 14, 2002

(30) Foreign Application Priority Data

May 10, 2001 (KR) ......................................... 2001-25569

(51) Int. Cl.$^7$ .............................................. H01L 29/788
(52) U.S. Cl. ....................... 257/316; 257/321; 257/325; 257/411
(58) Field of Search ............................... 257/410, 411, 257/412, 316, 321, 325

(56) References Cited

U.S. PATENT DOCUMENTS 5,952,692 A * 9/1999 Nakazato et al. ........... 257/321

FOREIGN PATENT DOCUMENTS

| JP | 2000-150862 | 5/2000 |
|---|---|---|
| KR | 1999-0052177 | 7/1999 |

* cited by examiner

Primary Examiner—Mark V. Prenty
(74) Attorney, Agent, or Firm—Lee & Sterba, P.C.

(57) ABSTRACT

A single electron memory device including quantum dots between a gate electrode and a single electron storage element and a method for manufacturing the same, wherein the single electron memory device includes a substrate on which a nano-scale channel region is formed between a source and a drain, and a gate lamination pattern including quantum dots on the channel region. The gate lamination pattern includes a lower layer formed on the channel region, a single electron storage medium storing a single electron tunneling through the lower layer formed on the lower layer, an upper layer including quantum dots formed on the single electron storage medium, and a gate electrode formed on the upper layer to be in contact with the quantum dots.

18 Claims, 8 Drawing Sheets

SINGLE ELECTRON MEMORY DEVICE COMPRISING QUANTUM DOTS BETWEEN GATE ELECTRODE AND SINGLE ELECTRON STORAGE ELEMENT AND METHOD FOR MANUFACTURING THE SAME

BACKGROUND OF THE INVENTION

1. Field of the Invention

The present invention relates to a memory device and method for manufacturing the same. More particularly, the present invention relates to a single electron memory device having quantum dots between a gate electrode and a single electron storage element and method for manufacturing the same.

2. Description of the Related Art

As the size of a metal-oxide-semiconductor field effect transistor (MOSFET) becomes smaller, problems arise that do not occur in larger devices. Thus, it becomes difficult to further reduce the size of the MOSFET. For example, as the size of the MOSFET device becomes smaller, problems occur such as lowering of threshold voltage caused by a decrease in effective channel length, drain induced barrier lowering (DIBL), punch-through, deterioration of a gate oxide layer, and an increase in leakage current due to hot carriers generated by an increase in the electrical field in the device. These problems complicate further reduction in the size of a MOSFET.

The most significant problem to be solved by continuously scaling the MOSFET to the range of nanometers (nm) is a physical limit. At the physical limit, the number of electrons participating in the operation of the device becomes similar to the number of thermally fluctuating electrons. Thus, proper operation of a miniaturized MOSFET at room temperature is not expected.

To overcome this problem, development of a new device structure, which may replace the current complementary MOSFET (CMOSFET) structure, is required. Recently, a single electron transistor (SET) has been studied as an alternative new device.

Coulomb blockade is a physical principle of the single electron device. In the single electron device, Coulomb blockade is a condition wherein tunneling is blocked under specific conditions. The specific conditions for Coulomb blockade are when the free energy of a total system, consisting of a charging energy and an electrostatic energy for a junction capacitance, increases or decreases when electrons tunnel through a minute size tunnel junction.

The SET is a switching device that controls current flowing through two tunnel junctions between quantum dots by controlling the Coulomb blockade conditions. The Coulomb blockade occurs through a gate potential, which is capacitively coupled to the quantum dots.

Quantum dots, which are coupled to a channel through a tunnel junction, are used as a storage electrode in a single electron memory device. The single electron memory device is a memory device for recognizing a variation in channel current due to charges stored in the quantum dots as information, "0" or "1."

Unlike in the MOSFET, the effects caused by thermal fluctuation decrease in the single electron device as the device becomes smaller. A property of the device is determined by the capacitance between the elements constituting the device rather than by the structure of the device. Thus, the single electron device is advantageous for device scaling.

Conventional single electron memory devices store electrons in a single quantum dot 14, as shown in FIG. 1 or in a hybrid structure having a high distribution density nano-crystal array 20, as shown in FIG. 2. In both structures, a MOSFET is used as a sense device. In FIGS. 1 and 2, reference numeral 10 denotes a substrate, reference characters S and D denote a source and a drain, and reference characters G and G1 denote a gate lamination.

In FIG. 1, the gate lamination G includes a tunneling oxide layer 12 formed on the substrate 10 between a source S and a drain D, a single quantum dot 14, and a control oxide layer 16 and a gate electrode 18, which cover the single quantum dot 14. In FIG. 2, the gate lamination G1 is similar to the gate lamination G of FIG. 1 but includes a nano-crystal array 20, instead of the single quantum dot 14.

The quantum dot 14 of the single electron memory device shown in FIG. 1 is formed using a nano-lithography technique. The nano-crystal array of the single electron memory device shown in FIG. 2 is formed utilizing a self-assembled growth method.

In the single electron memory devices, the thickness of the tunneling oxide layer 12 is the main factor determining the reliability of the device, retention time of information and speed of write/erase. The thickness of the control oxide layer 16 and the distribution density of the quantum dot are the main factors determining the extent of variation in threshold voltage.

In the conventional single electron memory devices, however, the quantum dot or the nano-crystal array is formed directly on the tunneling oxide layer 12, and thus, defects may occur in the tunneling oxide layer 12 while forming the quantum dot or the nano-crystal array. These defects may result in changes in the properties of the device thereby requiring many limitations in the formation of the quantum dot on the tunneling oxide layer 12.

For example, in order to implement single electron tunneling at room temperature when the quantum dot is formed of silicon, preferably, the size of the quantum dot is less than 10 nm. It is difficult, however, to form the quantum dot having a predetermined size due to the possibility of causing defects in the tunneling oxide layer. Hence, it becomes difficult to manufacture a single electron memory device, which operates at room temperature. Further, in the prior art single electron memory device, the retention time of information does not reach a practical standard.

SUMMARY OF THE INVENTION

A feature of an embodiment of the present invention provides a single electron memory device having quantum dots or an element having the same effect, which retains information long enough to be practical and prevents variation in the properties of the device.

Another feature of an embodiment of the present invention provides a method for manufacturing a single electron memory device.

An embodiment of the present invention provides a single electron memory device, including a substrate on which a nano-scale channel region is formed between a source and a drain, and a gate lamination pattern including quantum dots on the channel region.

The gate lamination pattern includes a lower layer formed on the channel region, a single electron storage medium formed on the lower layer for storing a single electron tunneling through the lower layer, an upper layer including quantum dots formed on the single electron storage medium, and a gate electrode formed on the upper layer to be in contact with the quantum dots.

The quantum dots are included in the upper layer and are isolated from the single electron storage medium. It is another feature of an embodiment of the present invention that the quantum dots contact the single electron storage medium and the gate electrode.

The upper layer is formed of a first and a second upper layer, and the quantum dots are formed in the second upper layer.

The single electron storage medium in an embodiment of the present invention is formed of a material selected from the group consisting of silicon nitride ($Si_3N_4$) or PZT having quantized trap sites at an interface with the lower layer or in the bulk, silicon (Si), silicon germanium (SiGe), gallium arsenide (GaAs), and a metal.

According to another feature of the present invention, there is provided a single electron memory device. The device includes a substrate on which a nano-scale channel region is formed between a source and a drain and a gate lamination pattern including quantum dots on the channel region. The gate lamination pattern includes a lower layer, an upper layer, and a gate electrode, which are sequentially formed on the channel region, and vertically spaced-apart first and second quantum dots included in the upper layer. The first quantum dots are in contact with the lower layer and the second quantum dots are in contact with the bottom surface of the gate electrode.

According to yet another feature of the present invention, there is provided a single electron memory device. The device includes a substrate on which a nano-scale channel region is formed between a source and a drain and a gate lamination pattern including quantum dots on the channel region. The gate lamination pattern includes a lower layer formed on the channel region, a single electron storage means formed on the lower layer for storing a single electron tunneling through the lower layer, an upper layer covering the single electron storage means, an upper surface of the upper layer being uneven, and a gate electrode formed on the upper layer.

The single electron storage means is formed of a material selected from the group consisting of silicon nitride ($Si_3N_4$), PZT, silicon (Si), silicon germanium (SiGe), gallium arsenide (GaAs), and a metal. The single electron storage means may also be quantum dots formed on the lower layer. The quantum dots are formed of a material selected from the group consisting of silicon nitride, silicon, silicon germanium, gallium arsenide, and a metal.

A further feature of the present invention provides a method for manufacturing a single electron memory device including a single electron storage element in a gate lamination pattern formed on a nano-scale channel region of a MOSFET. Forming the gate lamination pattern includes (a) sequentially forming a lower layer and a single electron storage medium for storing a single electron tunneling through the lower layer on a substrate, (b) forming an upper layer including quantum dots on the single electron storage medium, (c) forming a gate electrode layer on the upper layer to be in contact with the quantum dots, and (d) patterning the lower layer, the single electron storage medium, the upper layer, and the gate electrode layer, in reverse order.

Forming the upper layer may include forming a first upper layer on the single electron storage medium, forming the quantum dots on the first upper layer, and forming a second upper layer to cover the quantum dots on the first upper layer. Forming a gate electrode layer may further include polishing the upper layer until the quantum dots are exposed.

In another feature of the present invention there is provided a method for manufacturing a single electron memory device including a single electron storage element in a gate lamination pattern formed on a nano-scale channel region of a MOSFET, wherein forming the gate lamination pattern includes (a) forming a lower layer on a substrate, (b) forming an upper layer including vertically spaced-apart first and second quantum dots on the lower layer, (c) forming a gate electrode on the upper layer to be in contact with the second quantum dots, and (d) patterning the lower layer, the upper layer, and the gate electrode, in reverse order. Forming the upper layer may include forming the first quantum dots on the lower layer to store a single electron tunneling through the lower layer, forming a first upper layer to a thickness sufficient to cover the first quantum dots, forming the second quantum dots on the first upper layer, and forming a second upper layer to cover the second quantum dots on the first upper layer.

In still another feature of the present invention, there is provided a method for manufacturing a single electron memory device including a single electron storage element in a gate lamination pattern formed on a nano-scale channel region of a MOSFET. Forming the gate lamination pattern includes (a) forming a lower layer on a substrate, (b) sequentially forming a single electron storage means for storing a single electron tunneling through the lower layer and an upper layer covering the single electron storage means on the lower layer, wherein the surface of the upper layer is uneven, (c) forming a gate electrode layer on the upper layer, and (d) patterning the lower layer, the single electron storage means, the upper layer, and the gate electrode layer, in reverse order. The single electron storage means is quantum dots or the single electron storage medium.

Preferably, the lower layer may be formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$. Preferably, the upper layer may be formed of a material selected from the group consisting of silicon oxide ($SiO_2$), alumina ($Al_2O_3$), tantalum oxide ($TaO_2$), and titanium oxide ($TiO_2$). Preferably, the gate electrode may be formed of a material selected from the group consisting of doped Si, doped SiGe, doped GaAs, a metal, a silicide, and a polycide. Preferably, the quantum dots are formed of Si.

The single electron memory device according to an embodiment of the present invention includes a silicon nitride layer as a nano-scale storage medium between quantum dots, which are included on the bottom surface of a gate electrode, and a tunneling layer formed on a nano-scale channel region. As a result, the silicon nitride layer may be locally charged even in a nano-scale, and may retain information longer than a conventional single electron memory device using quantum dots as a data storage electrode. Further, in the present invention, the quantum dots are not included on a lower layer as a tunneling layer, but in an upper layer, thereby maintaining the properties of a device and allowing the quantum dots to be formed by various methods.

These and other features of the present invention will be readily apparent to those of ordinary skill in the art upon review of the detailed description that follows.

BRIEF DESCRIPTION OF THE DRAWINGS

The above features and advantages of the embodiments of the present invention will become more apparent by describing in detail preferred embodiments thereof with reference to the attached drawings, in which.

DETAILED DESCRIPTION OF THE INVENTION

Figure 1:
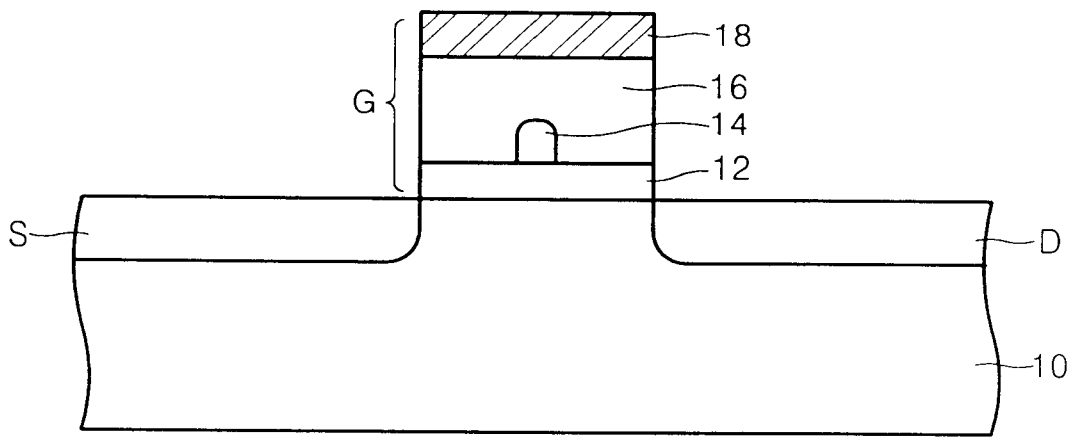
FIGS. 1 and 2 illustrate sectional views of conventional single electron memory devices.
Figure 2:
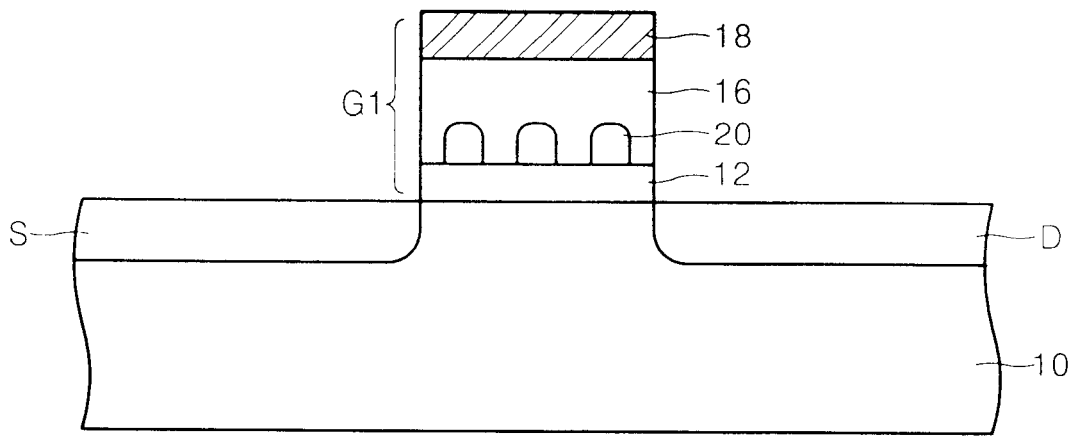

Korean Patent Application No. 2001-25569, filed May 10, 2001, and entitled: "Single Electron Memory Device Comprising Quantum Dots Between Gate Electrode and Single Electron Storage Element and Method for Manufacturing the Same," is incorporated by reference herein in its entirety.

Hereinafter, preferred embodiments of the present invention will be described in detail with reference to the accompanying drawings. The thickness of layers or regions shown in the drawings may be exaggerated for clarity. Like reference numerals denote like elements throughout the drawings. Additionally, detailed descriptions of structures and procedures are provided in the description of the embodiment of the present invention only when each is first introduced. In the detailed description, even though the phrase 'single electron storage medium' is intended as a specific case of the phrase 'single electron storage means,' in some instances use of the phrase 'single electron storage medium' may indicate the broader 'single electron storage means.'

Several embodiments of a single electron memory device according to the present invention will now be described.

First Embodiment

Figure 3:
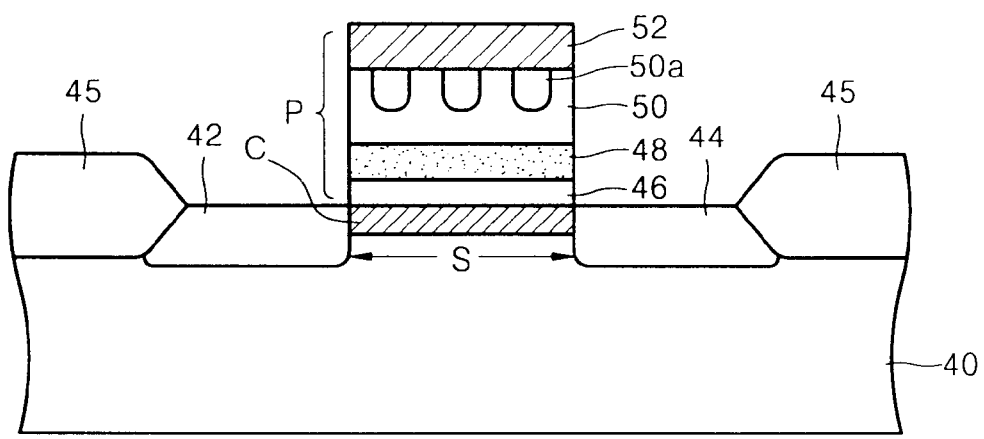
FIGS. 3 through 6 illustrate sectional views of a single electron memory device including quantum dots between a gate electrode and a single electron storage element, according to a first through a fourth embodiment of the present invention, respectively.

Referring to FIG. 3, reference numeral 40 denotes a substrate on which a MOSFET is formed. The substrate 40 may be a P-type or N-type semiconductor substrate, for example, a silicon substrate, depending on the type of the MOSFET. Reference numerals 42 and 44 denote first and second conductive impurity regions, which are formed on the substrate 40. More particularly, the first and second conductive impurity regions are a source region and a drain region. Reference numeral 45 denotes a field oxide layer, more particularly, a LOCOS-type oxide layer. The first and second conductive impurity regions 42 and 44 are spaced apart from each other by a distance S, preferably several tens of nanometers (nm). As a result, the scale of a channel region C formed on the upper portion of the substrate 40 between the first and second conductive impurity regions 42 and 44 is in nano-scale.

A gate lamination pattern P is formed on the channel region C. The gate lamination pattern P includes a lower layer 46, a single electron storage medium 48, an upper layer 50, and a gate electrode 52, which are sequentially formed on the channel region C.

The lower layer 46 is a tunneling layer for tunneling of a single electron. Preferably, the lower layer 46 is formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$. Most preferably, the lower layer is formed of silicon oxide ($SiO_2$) to a thickness of several nanometers (for example, less than 5 nm).

Preferably, the single electron storage medium 48 is formed of silicon nitride ($Si_3N_4$) or PZT having quantized trap sites at an interface with the lower layer 46 or in the bulk. However, the single electron storage medium 48 may also be formed of silicon (Si) or other compound semiconductor materials such as SiGe and GaAs, and metal materials, such as Al.

Preferably, the upper layer 50 is formed of the same material as the lower layer 46, for example, silicon oxide ($SiO_2$). The upper layer 50, however, may also be formed of a material different from the lower layer 46. Quantum dots 50a are included in the upper layer 50. Specifically, the quantum dots 50a are isolated from the single electron storage medium 48 but are in contact with a bottom surface of the gate electrode 52. The gate electrode 52 is formed on a surface including an upper surface of the quantum dots 50a and the upper layer 50. The quantum dots 50a in the upper layer 50 charge a region corresponding to the single electron storage medium 48, that is, the quantum dots locally charge the single electron storage medium 48. Thus, the size of the quantum dots 50a is preferably small enough to implement single electron tunneling at room temperature. For example, in a case where the quantum dots 50a are formed of silicon (Si), the size of the quantum dots 50a is preferably less than 10 nm.

The gate electrode 52 is formed of a material selected from the group consisting of a doped elemental semiconductor material such as silicon (Si), a compound semiconductor material such as SiGe or GaAs, and a metal such as Al.

Although not shown, a gate spacer may be further formed at a side of the gate lamination pattern P. In such a case, the first and second conductive impurity regions 42 and 44 are of LDD-type having impurity regions into which impurities are deeply injected using the gate spacer as a mask.

Operation of the single electron memory device will now be described. When voltage is applied to the gate electrode 52, the single electron storage medium 48 is charged with a single electron tunneling through the lower layer 46, coupling the nano-scale channel region C to the quantum dots 50a contacting the bottom surface of the gate electrode 52, resulting in a new Coulomb blockade. Thus, even if the voltage applied to the gate electrode 52 after the single electron storage medium 48 is charged with the single electron increases by a predetermined value, further electron tunneling does not occur. That is, although the voltage applied to the gate electrode 52 after the single electron tunneling increases to a predetermined voltage, further single electron tunneling is blockaded, resulting in a single electron charging phenomenon. Current flowing between the source and the drain regions is blocked or not blocked using the phenomenon, thereby implementing the operation of the single electron memory device.

Specifically, the single electron tunneling through the lower layer 46 for storage in the single electron storage medium 48 is accomplished by applying a voltage Vd to the drain region and a voltage Vg to the gate electrode 52, thereby performing a data write operation.

In a case where the MOSFET is maintained in an "on" state by applying a voltage Vd' to the drain region and by applying a voltage Vg' to the gate electrode 52, it is considered that data "1" is read when current flow between the source and drain regions is greater than a reference current, and it is considered that data "0" is read when current flow between the source and drain regions is less than a reference current, thereby performing a data read operation.

When the source and drain regions and the substrate are maintained in a ground state, and an erase voltage (<0) is applied to the gate electrode 52, an electron stored in the single electron storage medium 48 is discharged, thereby performing a data erase operation.

The above description of the operation of the single electron memory device according to the first embodiment also applies to the operation of the single electron memory device according to the following second through fourth embodiments.

Second Embodiment

The single electron memory device according to a second embodiment of the present invention is a single electron storage means using quantum dots.

Figure 4:
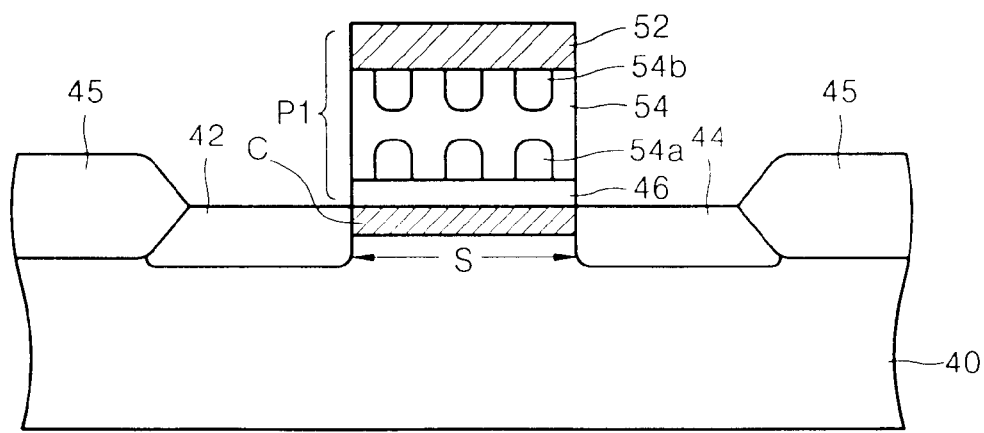

In detail, referring to FIG. 4, a gate lamination pattern P1 is formed on the channel region C of a substrate 40. The gate lamination pattern P1 includes a lower layer 46, an upper layer 54, and a gate electrode 52, which are sequentially formed on the channel region of a substrate 40. A plurality of vertically spaced-apart first and second quantum dots 54a and 54b are included in the upper layer 54. The first quantum dots 54a are formed on the lower layer 46 at a predetermined interval. The second quantum dots 54b are formed above the first quantum dots 54a and are in contact with the bottom surface of the gate electrode 52. The first quantum dots 54a function as the single electron storage medium (48 of FIG. 3) of the first embodiment.

Third Embodiment

Figure 5:
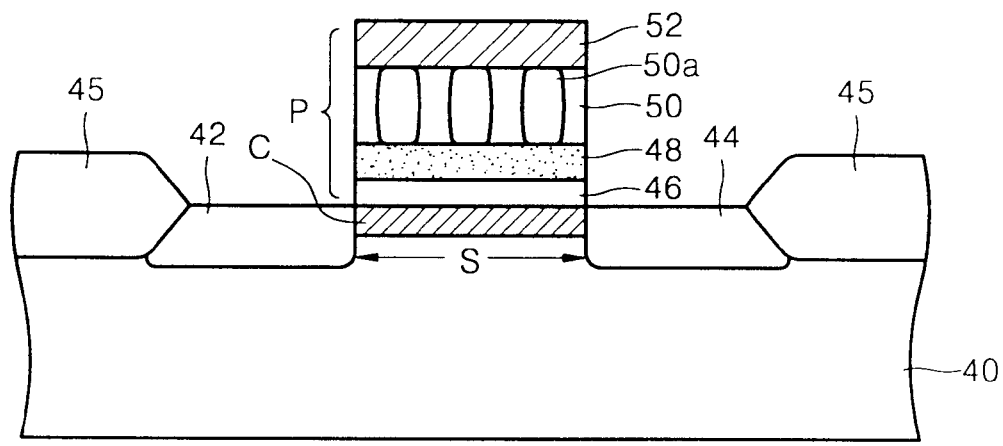

As shown in FIG. 5, the structure of the single electron memory device according to the third embodiment is similar to the structure of the single electron memory device according to the first embodiment. However, in the third embodiment, the quantum dots 50a, included between a gate electrode 52 and a single electron storage medium 48, are not only in contact with the bottom surface of the gate electrode 52 but are also in contact with the single electron storage medium 48. In this case, since the gate electrode 52 locally contacts the nano-scale single electron storage medium 48, the local charging rate of the single electron storage medium 48 may increase.

Fourth Embodiment

The single electron memory device according to the fourth embodiment of the present invention includes an upper layer having an uneven upper surface thereby providing the same effect as quantum dots, without including quantum dots on the bottom surface of the gate electrode in the structure of a gate lamination pattern.

Figure 6:
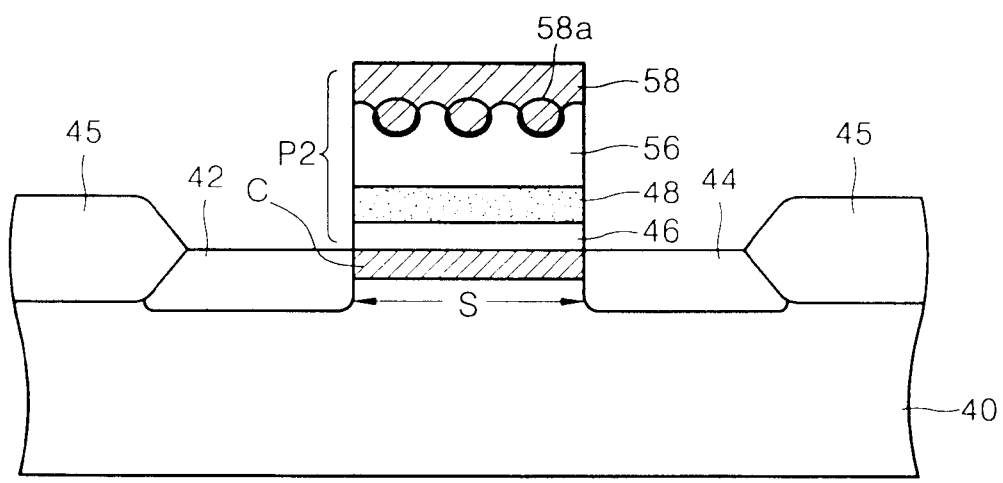

In detail, referring to FIG. 6, a gate lamination pattern P2 includes a lower layer 46, a single electron storage medium 48, an upper layer 56, and a gate electrode 58, which are sequentially formed on the channel region C of substrate 40. An upper surface of the upper layer 56 is uneven. As a result, a bottom surface of the gate electrode 58 formed on the upper layer 56 is similarly uneven. Downward protruding portions 58a of the bottom surface of the gate electrode 58, which fill recessed portions in the upper surface of the upper layer 56, are nearer to the single electron storage medium 48 than other portions, and consequently, the single electron storage medium 48 may be locally charged from the protruding portions 58a. As a result, the effect of protruding portions 58a on the bottom surface of the gate electrode 58 are equivalent to quantum dots contacting the surface when the bottom surface of the gate electrode 58 is a smooth plane.

Next, various embodiments of a method for manufacturing a single electron memory device according to the present invention will be described.

Fabrication Method for Device of the First Embodiment

Figure 7:
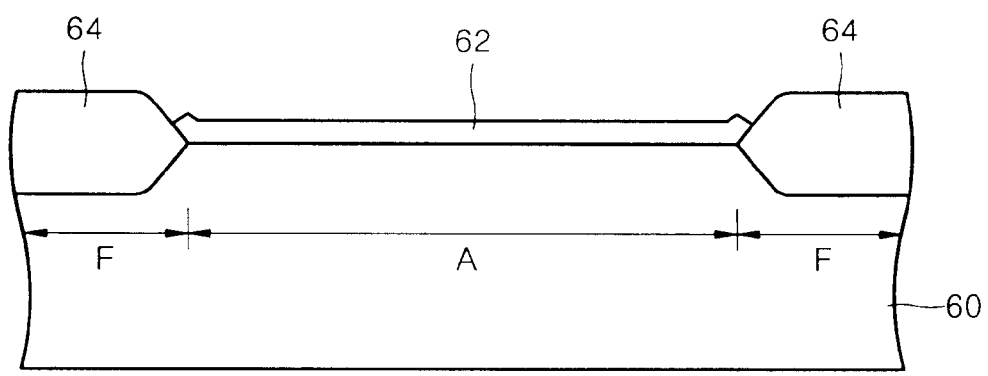
FIGS. 7 through 10 illustrate sectional views of a method for manufacturing the single electron memory device of FIG. 3.

Referring to FIG. 7, an active region A on which a semiconductor device is formed, and a field region F for insulating the semiconductor device are defined on a substrate 60 formed of a P-type or N-type semiconductor. An insulating layer pattern 62 is formed on the substrate 60 to cover the active region A. A field oxide layer 64 is formed on the field region F using the insulating layer pattern 62 as a mask. The field oxide layer 64 is a LOCOS oxide formed by oxidizing the field region F. Next, the insulating layer pattern 62 is removed.

Figure 8:
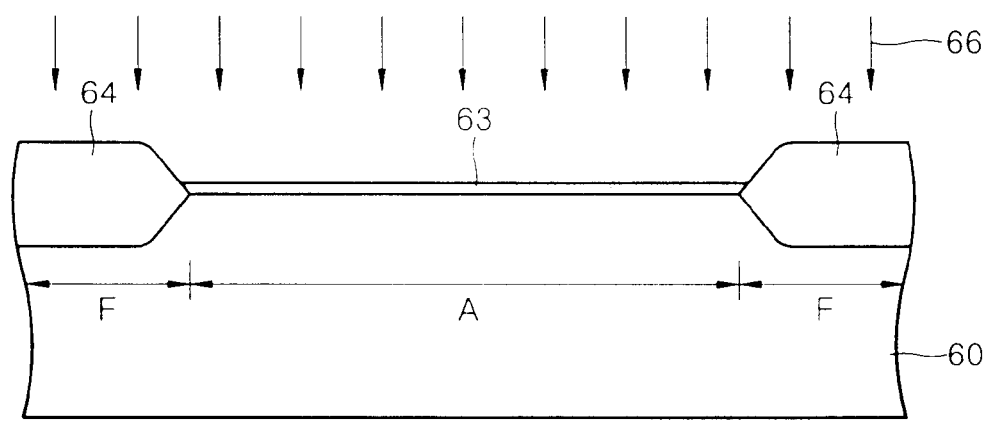

Referring to FIG. 8, a sacrificial oxide layer 63 is formed on a region from which the insulating layer pattern 62 is removed. Then, conductive impurities 66 for forming a channel region are ion-implanted into the active area A through the entire surface of the sacrificial oxide layer 63. Next, the sacrificial oxide layer 63 is removed.

Figure 9:
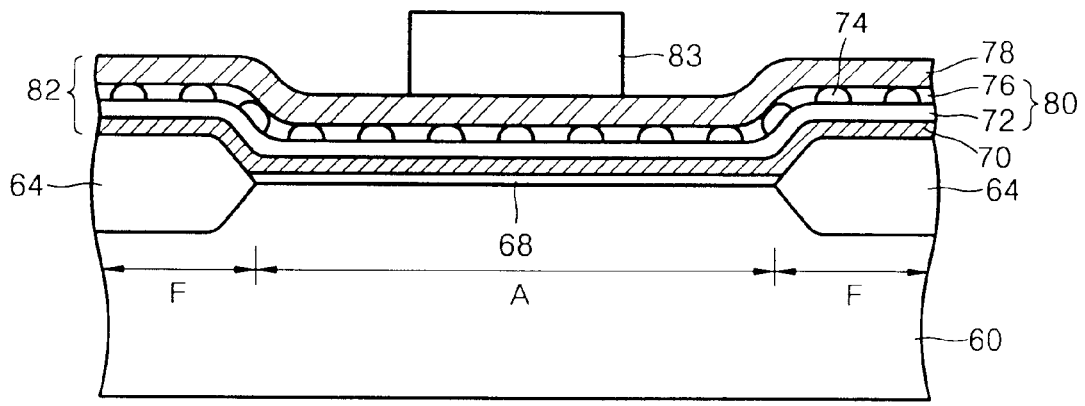

Subsequently, referring to FIG. 9, a gate insulating layer 68 is formed on the active region A. The gate insulating layer 68 is a tunneling layer for single electron tunneling and is used as a lower layer of a gate laminated pattern. Accordingly, hereinafter, the gate insulating layer 68 is referred to as lower layer 68. The lower layer 68 is formed of a material selected from the group consisting of silicon oxide ($SiO_2$), alumina ($Al_2O_3$), tantalum oxide ($TaO_2$), and titanium oxide ($TiO_2$). Preferably, the lower layer 68 is formed of silicon oxide ($SiO_2$). A single electron storage medium 70 and a first upper layer 72 are sequentially formed on the lower layer 68. Preferably, the single electron storage medium 70 is formed of nano-scale silicon nitride ($Si_3N_4$) having a quantized trap site at an interface with the lower layer 68 or in the bulk. The single electron storage medium 70, however, may also be formed of an elemental semiconductor material such as silicon (Si), a compound semiconductor material such as silicon germanium (SiGe) or gallium arsenide (GaAs), or a metal, for example, aluminum (Al). Preferably, the first upper layer 72 is formed of the same material as the lower layer 68, which is preferably silicon oxide ($SiO_2$), but it may also be formed of a material different from the lower layer 68.

A plurality of quantum dots 74, a second upper layer 76, and a gate electrode layer 78 are sequentially formed on the first upper layer 72. The quantum dots 74 are formed by a selective growth method, a self-assembled growth method, or a nano-scale lithography method. Preferably, the quantum dots are formed of Si. The second upper layer 76 is preferably formed of the same material as the first upper layer 72. Thus, hereinafter, the first and second upper layers 72 and 76 together are collectively referred to as upper layer 80. The gate electrode layer 78 is formed of a material selected from the group consisting of a doped elemental semiconductor material such as doped silicon (Si) layer, a compound semiconductor material such as silicon germanium (SiGe) or gallium arsenide (GaAs), and a metal, such as aluminum (Al). The doped silicon (Si) layer may be formed of a silicon layer in which conductive impurities are previously doped or a pure silicon layer into which the conductive impurities are subsequently diffused. The conductive impurities are first injected into the entire surface of the substrate.

In order to apply voltage to the quantum dots 74, the gate electrode layer 78 should be in contact with the quantum dots 74. Thus, in a case where the quantum dots 74 are not exposed on the surface of the second upper layer 76 after the second upper layer 76 is formed, the second upper layer 76 is polished until the quantum dots 74 are exposed to contact the gate electrode layer 78. The polishing is performed by a chemical mechanical polishing (CMP) method or an etch back method.

Accordingly, a gate lamination layer stack 82, including the lower layer 68, the single electron storage medium 70, and the upper layer 80 including the quantum dots 74, is formed on the substrate 60.

Next, a photosensitive layer (not shown) is coated on the gate electrode layer 78. Then, the photosensitive layer is patterned using a nano-scaled lithography method, for example, a lithography method using an electron beam. In this way, a photosensitive layer pattern 83 for defining a nano-scale channel region and a gate is formed on the gate electrode layer 78. Preferably, the photosensitive layer is formed of a photoresist that is appropriate for nano-scale lithography.

Figure 10:
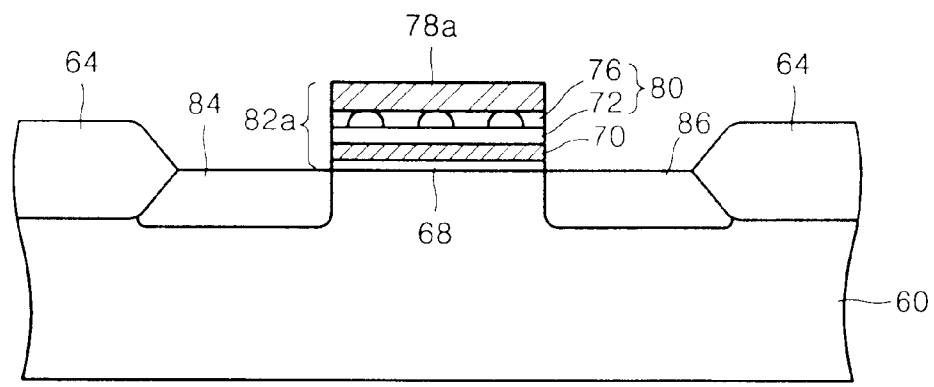

The lower layer 68, the single electron storage medium 70, the upper layer 80 including the quantum dots 74, and the gate electrode layer 78 are etched in reverse order using the photosensitive layer pattern 83 as an etching mask, until the substrate 60 is exposed. Next, the photosensitive layer pattern 83 is removed. As shown in FIG. 10, a gate lamination pattern 82a, including the lower layer 68, the single electron storage medium 70, the upper layer 80 including the quantum dots 74, and a gate electrode 78a, is formed on the channel region C of the substrate 60.

Referring to FIG. 10, first and second conductive impurity regions 84 and 86 are formed to a predetermined depth by implanting conductive impurities into the entire surface of the substrate 60 using the gate lamination pattern 82a as a mask. P-type conductive impurities are used when the substrate 60 is an N-type substrate, and N-type conductive impurities are used when the substrate 60 is a P-type substrate. The first conductive impurity region 84 is a source region, and the second conductive impurity region 86 is a drain region. Thus, the fabrication of the single electron memory device according to the first embodiment is complete.

Next, a process of forming a gate spacer (not shown) at a side of the gate lamination pattern 82a, and a process of implanting conductive impurities into the entire surface of the substrate using the gate lamination pattern 82a as a mask may be further performed. In this case, the conductive impurities are implanted deeper than when conductive impurities are implanted into the first and second conductive impurity regions 84 and 86. Accordingly, the source and drain regions are formed of an LDD-shape.

Fabrication Method for Device of the Second Embodiment

In a method for manufacturing the single electron memory device according to the second embodiment, the formation of a single electron storage medium in a gate lamination pattern differs from the fabrication method for the device in first embodiment.

Figure 11:
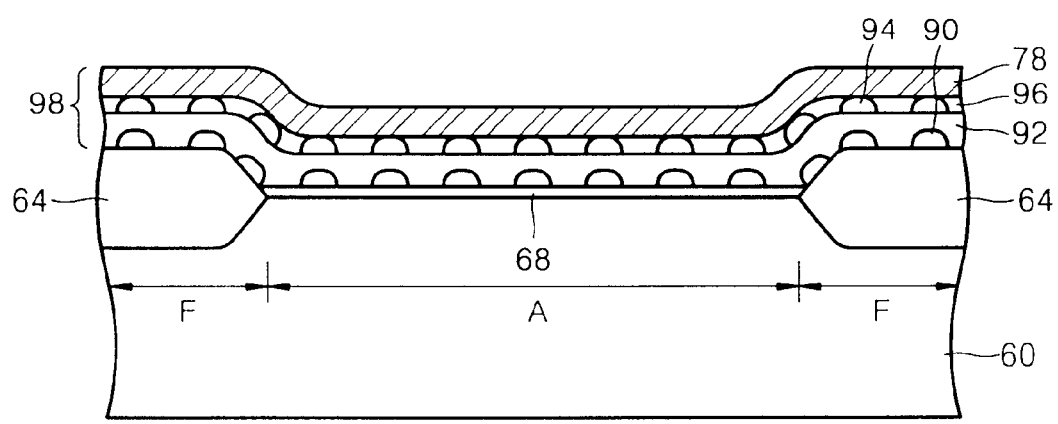
FIGS. 11 and 12 illustrate sectional views of a method for manufacturing the single electron memory device of FIG. 4.

In detail, referring to FIG. 11, forming the lower layer 68 is accomplished as in the first embodiment. Next, first quantum dots 90 are formed on the lower layer 68. The first quantum dots 90 are used as a single electron storage means for storing a single electron tunneling through the lower layer 68, as in the single electron storage medium 70. The first quantum dots 90 are formed similarly to the formation of the quantum dots 74 in the first embodiment. A first upper layer 92 for covering the first quantum dots 90 is formed on the lower layer 68. Preferably, the first upper layer 92 is formed of silicon oxide ($SiO_2$) or may be formed similarly to the formation of the lower layer 68 or the upper layer 80 in the first embodiment. Moreover, the first upper layer 92 is preferably formed to a thickness sufficient to cover the first quantum dots 90. Next, second quantum dots 94 are formed on the first upper layer 92. The second quantum dots 94 are formed by the same method used to form the first quantum dots 90.

Preferably, the first and second quantum dots 90 and 94 are formed to a size enabling single electron tunneling at room temperature. For example, in a case where the first and second quantum dots 90 and 94 are formed of silicon (Si), their size is preferably less than 10 nm.

A second upper layer 96 for covering the second quantum dots 94 is formed on the first upper layer 92. The second upper layer 96 is formed of the same material as the material forming the first upper layer 92. In a case where the second quantum dots 94 are not exposed, the entire surface of the second upper layer 96 is polished until the second quantum dots 94 are exposed, as described in connection with the first embodiment.

Figure 12:
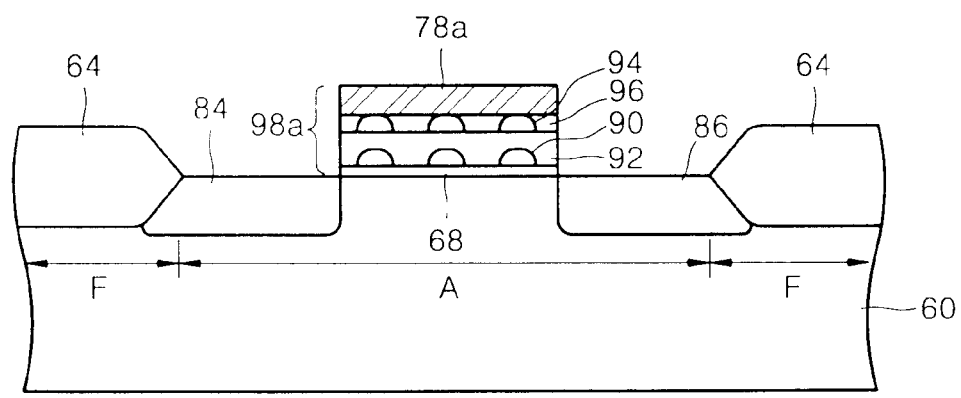

Subsequently, a gate electrode layer 78 is formed on the second upper layer 96. A gate lamination layer stack 98 including the lower layer 68, the first upper layer 92 including the first quantum dots 90, the second upper layer 96 including the second quantum dots 94, and the gate electrode layer 78, is formed on the substrate 60. Next, as shown in FIGS. 11 and 12, the gate lamination layer 98 is patterned in a nano-scale and a gate lamination pattern 98a of a nano-scale is formed on the substrate 60 in the same way as the gate lamination pattern 82a is formed in the first embodiment.

Fabrication Method for Device of the Third Embodiment

In a method for manufacturing the single electron memory device according to the third embodiment, quantum dots 100 are formed in contact with a single electron storage medium 70.

Figure 13:
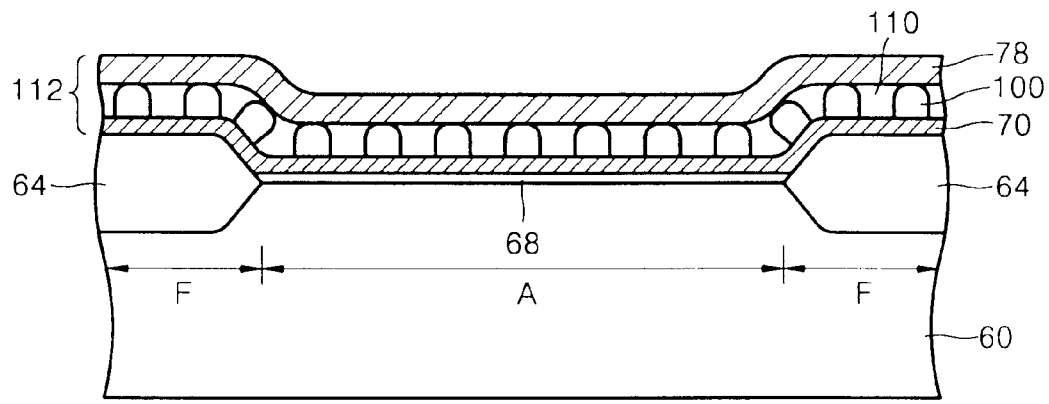
FIGS. 13 and 14 illustrate sectional views of a method for manufacturing the single electron memory device of FIG. 5.

In detail, referring to FIG. 13, the single electron storage medium 70 is formed according to the first embodiment. Next, quantum dots 100 are formed on the single electron storage medium 70. The quantum dots 100 are formed like the quantum dots 74 in the first embodiment. Preferably, an upper layer 110 is formed on the single electron storage medium 70 such that an upper portion of each of the quantum dots 100 is exposed. This result is obtained by controlling the deposition of the upper layer 110 on the single electron storage medium 70, or by polishing the entire surface of the upper layer 110 after the upper layer 110 is formed to expose the quantum dots 100. Preferably, the latter method is used. The polishing may be performed by a CMP method or an etch back method.

Figure 14:
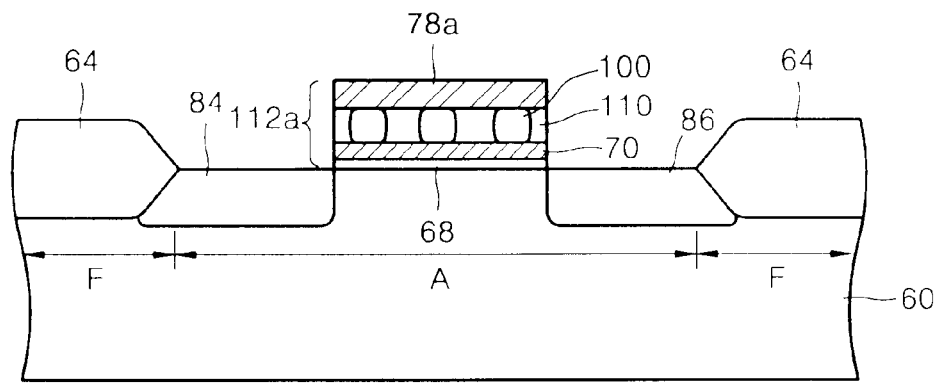

Subsequently, a gate electrode layer 78 is formed on the upper layer 110 and the exposed quantum dots 100. Thus, a gate lamination layer 112 is formed on the substrate 60. Next, as shown in FIG. 14, a gate lamination pattern 112a of a nano-scale is formed on the substrate 60 in the same way as the gate lamination pattern 82a is formed in the first embodiment.

Fabrication Method for Device of the Fourth Embodiment

Figure 15:
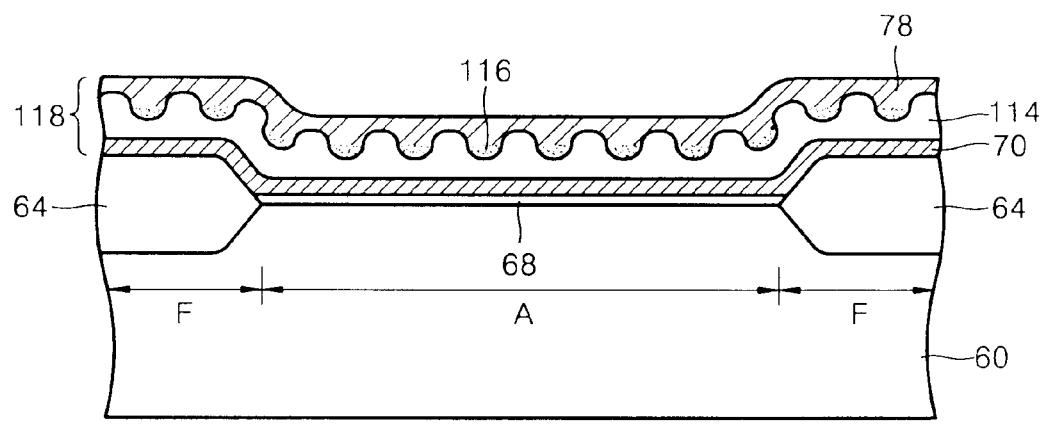
FIGS. 15 and 16 illustrate sectional views of a method for manufacturing the single electron memory device of FIG. 6.

A method for manufacturing the single electron memory device according to the fourth embodiment has an equivalent effect when the surface of an upper layer contacting the bottom surface of a gate electrode layer is uneven as when quantum dots are formed, but without forming quantum dots contacting the bottom surface of a gate electrode layer between the gate electrode layer and a single electron storage medium. In detail, referring to FIG. 15, the formation of a single electron storage medium 70 is the same as in the first embodiment. Next, an upper layer 114 is formed on the single electron storage medium 70. At this time, process conditions are controlled to increase the surface roughness of the upper layer 114. As a result, as shown in FIG. 15, an upper surface of the upper layer 114 is uneven. If a gate electrode layer 78 is formed on the upper layer 114, the gate electrode layer 78 fills the uneven portions of the upper layer 114. A recessed portion 116 of the upper layer 114, filled by the gate electrode layer 78, may correspond to the quantum dots having a size appropriate for single electron tunneling at room temperature. In this way, the same effect as when quantum dots are formed is obtained without formation of the quantum dots.

Figure 16:
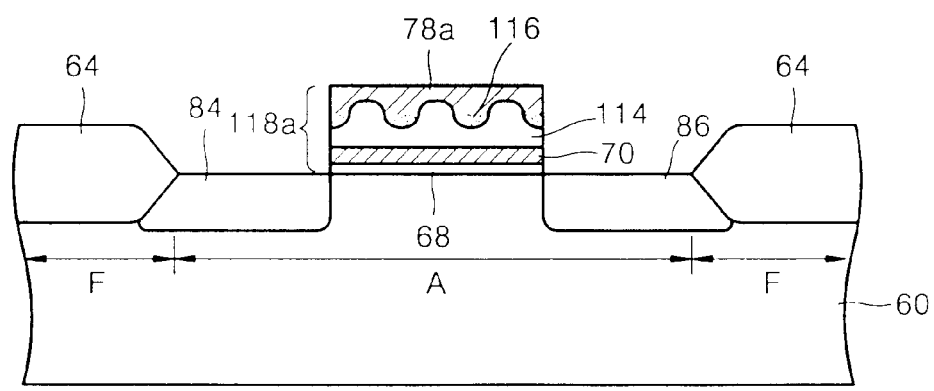

Subsequently, a gate lamination layer stack 118, formed on the substrate 60, is patterned, thereby forming a gate lamination pattern 118a of a nano-scale on the substrate 60, as shown in FIG. 16. This formation of the gate lamination pattern 118a is performed as in the first embodiment.

In addition to the first through fourth embodiments of the present invention described above, there may be combinations thereof or other embodiments. For example, the second and fourth embodiments may be combined, wherein the single electron storage medium 70 of FIGS. 15 and 16 is replaced by the first quantum dots 90 of the second embodiment.

As described above, the single electron memory device according to the present invention includes a silicon nitride layer as a nano-scale storage medium between quantum dots, which are included on the bottom surface of a gate electrode, and a tunneling layer, which is formed on a nano-scale channel region. As a result, the silicon nitride layer may be locally charged even in a nano-scale and may retain information longer than a conventional single electron memory device using quantum dots as a data storage electrode. Further, in the present invention, the quantum dots are not included in a lower layer as a tunneling layer, but in an upper layer, thereby maintaining the properties of a device intact and allowing the quantum dots to be formed by various methods. Thus, single electron tunneling may be implemented at room temperature, and the properties of the device may be maintained.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims. For example, one skilled in the art will understand that the electric resistance of the gate electrode may be reduced more by forming the gate electrode of silicide or polycide, and that the single electron storage medium may be formed of a multi-layer structure. Further, a field oxide layer having another shape (not a LOCOS oxide layer), for example, a trench-type oxide layer, may be formed on a field region of the substrate.

What is claimed is:

1. A single electron memory device comprising:
    a substrate on which a nano-scale channel region is formed between a source and a drain; and
    a gate lamination pattern including quantum dots on the channel region; and
    wherein the gate lamination pattern includes:
        a lower layer formed on the channel region;
        a single electron storage medium formed on the lower layer, for storing a single electron tunneling through the lower layer;
        an upper layer, including a plurality of quantum dots, formed on the single electron storage medium; and
        a gate electrode formed on the upper layer to be in contact with the quantum dots.

2. The single electron memory device as claimed in claim 1, wherein the plurality of quantum dots are included in the upper layer and are isolated from the single electron storage medium.

3. The single electron memory device as claimed in claim 1, wherein the plurality of quantum dots are included in the upper layer and contact the single electron storage medium.

4. The single electron memory device as claimed in claim 1, wherein the upper layer is formed of a first and a second upper layer and the plurality of quantum dots are included in the second upper layer.

5. The single electron memory device as claimed in claim 1, wherein the single electron storage medium is formed of a material selected from the group consisting of silicon nitride ($Si_3N_4$), PZT, silicon (Si), silicon germanium (SiGe), gallium arsenide (GaAs), and a metal.

6. The single electron memory device as claimed in claim 2, wherein the single electron storage medium is formed of a material selected from the group consisting of silicon nitride ($Si_3N_4$), PZT, silicon (Si), silicon germanium (SiGe), gallium arsenide (GaAs), and a metal.

7. The single electron memory device as claimed in claim 3, wherein the single electron storage medium is formed of a material selected from the group consisting of silicon nitride ($Si_3N_4$), PZT, silicon (Si), silicon germanium (SiGe), gallium arsenide (GaAs), and a metal.

8. The single electron memory device as claimed in claim 1, wherein the lower layer is formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$.

9. The single electron memory device as claimed in claim 1, wherein the upper layer is formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$.

10. The single electron memory device as claimed in claim 1, wherein the gate electrode is formed of a material selected from the group consisting of doped Si, doped SiGe, doped GaAs, a metal, a silicide, and a polycide.

11. The single electron memory device as claimed in claim 1, wherein the plurality of quantum dots are preferably formed of silicon.

12. A single electron memory device comprising:
    a substrate on which a nano-scale channel region is formed between a source and a drain; and
    a gate lamination pattern including a plurality of quantum dots on the channel region,
    wherein the gate lamination pattern includes:
        a lower layer formed on the channel region;
        a single electron storage means formed on the lower layer, for storing a single electron tunneling through the lower layer;
        an upper layer covering the single electron storage means, the upper surface of the upper layer being uneven; and a gate electrode formed on the upper layer.

13. The single electron memory device as claimed in claim 12, wherein the single electron storage means is formed of a material selected from the group consisting of silicon nitride ($Si_3N_4$), silicon (Si), silicon germanium (SiGe), gallium arsenide (GaAs), and a metal.

14. The single electron memory device as claimed in claim 12, wherein the single electron storage means is a plurality of quantum dots formed on the lower layer.

15. The single electron memory device as claimed in claim 12, wherein the lower layer is formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$.

16. The single electron memory device as claimed in claim 12, wherein the upper layer is formed of a material selected from the group consisting of silicon oxide ($SiO_2$), alumina ($Al_2O_3$), tantalum oxide ($TaO_2$), titanium oxide ($TiO_2$), $HfO_2$ and $ZrO_2$.

17. The single electron memory device as claimed in claim 12, wherein the gate electrode is formed of a material selected from the group consisting of doped Si, doped SiGe, doped GaAs, a metal, a silicide, and a polycide.

18. The single electron memory device as claimed in claim 12, wherein the plurality of quantum dots are preferably formed of silicon.

* * * * *